United States Patent [19]

Nelson

[11] Patent Number: 5,366,802
[45] Date of Patent: Nov. 22, 1994

[54] THIN PYROELECTRIC IR DETECTOR COMPOSED OF SINTERED METAL OXIDES

[75] Inventor: Elizabeth H. Nelson, Springfield, Va.

[73] Assignee: The United States of America as represented by the Secretary of the Army, Washington, D.C.

[21] Appl. No.: 983,903

[22] Filed: Dec. 1, 1992

Related U.S. Application Data

[62] Division of Ser. No. 693,470, Apr. 30, 1991, Pat. No. 5,242,537.

[51] Int. Cl.$^5$ ............................................. G01D 15/10
[52] U.S. Cl. ................................... 428/336; 315/359; 346/76 R; 428/332; 428/210; 428/446; 428/701
[58] Field of Search ............... 428/332, 701, 336, 702, 428/446, 210; 346/76 R; 315/359

[56] References Cited

U.S. PATENT DOCUMENTS

| | | | |
|---|---|---|---|
| 4,278,493 | 7/1981 | Petvai | 156/643 |
| 4,460,434 | 7/1984 | Johnson et al. | 156/657 |
| 4,604,176 | 8/1986 | Paul | 428/695 |
| 4,750,979 | 6/1988 | Gee et al. | 204/192.3 |
| 4,906,594 | 3/1990 | Yoneda et al. | 437/228 |
| 4,986,676 | 1/1991 | Zeto et al. | 156/643 |
| 5,242,537 | 9/1993 | Nelson | 156/643 |

*Primary Examiner*—A. Turner
*Attorney, Agent, or Firm*—Milton W. Lee; John E. Holford; Anthony T. Lane

[57] ABSTRACT

An improved infrared detector element and an improved method for manufacturing same is provided. A commercially available rough art wafer of ferroelectric material is ion milled under conditions which provide an extremely thin element with a near flawless detection surface.

13 Claims, 2 Drawing Sheets

THIN PYROELECTRIC IR DETECTOR COMPOSED OF SINTERED METAL OXIDES

The invention described herein may be manufactured, used, and licensed by the U.S. Government for governmental puposes without the payment of any royalties thereon.

This application is a division, of application Ser. No. 07/693,470, now U.S. Pat. No. 5,242,537 filed Apr. 30, 1991.

BACKGROUND OF INVENTION

1. Field

The invention is related to ion milling methods and uncooled detectors for imagers which operate in the infrared and far-infrared spectrum. These detectors rely on ferro-electric or pyroelectric materials which become electrically polarized when exposed to infrared radiation.

2. Prior Art

The first pyroelectric imagers were made from thin wafers of very fragile materials with moderate sensitivities in order to utilize phase transitions that occur somewhat near room temperature. Such materials as Tri-Glycine Sulfate (TGS) and Potassium Dihydrogen Phosphate (KDP) are relatively easy to fabricate in the necessarily thin sheets needed to provide rapid response and retard heat dispersion. These materials had transitions temperatures around 300° K. Barium titanate, which is a more durable material, has a much higher value of spontaneous polarization, but is difficult to fabricate and its transition temperature is about 400° K. In the first pyroelectric imagers detectors these wafers, i.e. TGS and KDP, were incorporated into vacuum tubes known as pyroelectric vidicons and required a coating of silicon oxide to withstand the erosion of an electron beam that scanned it.

Recent work in titanates has produced more rugged fine grain detectors that operate much closer to room temperature. These may be thinned and combined with charge-coupled-devices based on silicon microelectronic technology to produce a more rugged, more sensitive and highly efficient imager. The titanates are initially produced as a fine grain powder precipitated using an alkoxide route. A wafer shaped detector is formed from this powder by high pressure compaction, sintering and thin slicing of the resultant mass with a gem saw. The result is a wafer several mils thick with a rough surface. To operate properly the wafer must have a surface which retains bulk material properties and a fairly uniform thickness of the order of one mil or less.

Efforts to mechanically grind the above wafer to a thickness of one mil have resulted in surface damage to the molecular structure of the remaining titanates. This is mainly due to a reduction in the oxygen content. To avoid this a liquid etch has been attempted. The etch, however, severely contaminates the wafer, so that even vacuum purging techniques do not remove it. An object of the present invention is, therefore, to provide a detector made from titanates which has the required molecular structure, thickness and surface structure.

SUMMARY OF THE INVENTION

The invention provides a titanate, ferroelectric, pyroelectric wafer on the order of one mil thick and a method of thinning pyroelectric wafers and the like by ion milling. Proper thinning requires that the ion beam strike the surface at a very large angle to the surface normal. More importantly the oxygen removed from molecules or metal ions that remain in the finished surface must be replaced while the beam maintains these surface elements in a receptive state.

BRIEF DESCRIPTION OF THE DRAWINGS

The invention is best understood with reference to the drawings wherein.

DESCRIPTION OF THE PREFERRED EMBODIMENTS

The most popular infrared detectors, particularly for imaging devices at the present time are solid state diodes. This is particularly true in the visible spectrum where the diodes can be made using silicon technology, which is highly advanced and reliable. To achieve the same results in the infrared and far-infrared spectrums requires the use of more exotic semiconductor materials such as the semiconductor compounds of elements from columns III–V and II–VI of the periodic table, like gallium-arsenide galliumarsenide and mecury-cadmium-telluride. The main drawback to these materials, aside from the extreme toxicity of their forming agents, is the cooling required to make them perform efficiently. Liquid nitrogen dewars and helium based cooling compressors are commonly used with such semiconductors.

The pyroelectric or ferroelectric detectors on the other hand require no cooling and in fact until recently they have required a large positive ceisius temperature bias, which, though not desireable, is much easier to achieve than 77° Kelvin or less. Manufacturing pyroelectric imagers, however, has proved to be a formidable task. Even after a skilled cadre of production line workers are assembled, device failure continue to remain high. Factors as diverse as the body chemistry of the workers have been investigated. It is believed that the use of rugged ceramic titanates will reverse this trend.

A new problem arose, however, when it came to the final sizing and polishing of the titanate wafers. The latest precipitation techniques provide an extremely fine grain structure which can support a wafer one mil thick with even thickness and fairly even surfaces. This would provide a low mass detector with uniform thermal properties and the high lateral resistance to heat flow that imagers require. Mechanical abrasion, however, severely damages the ferroelectric and pyroelectric properties of the material. Apparently the abrading process removes much of the oxygen from the trioxide molecular structures to change these properties. To avoid this, the wafers were first ground and then chemically etched with a suitable liquid reducing agent. This produced the desired thinning but, small quantities of the etching material worked its way into the wafer surface structure and could not be removed. Again the etching severely damages the ferroelectric and pyroelectric properties of the wafer. To avoid this damage, this patentee turned to ion milling.

Figure 1:
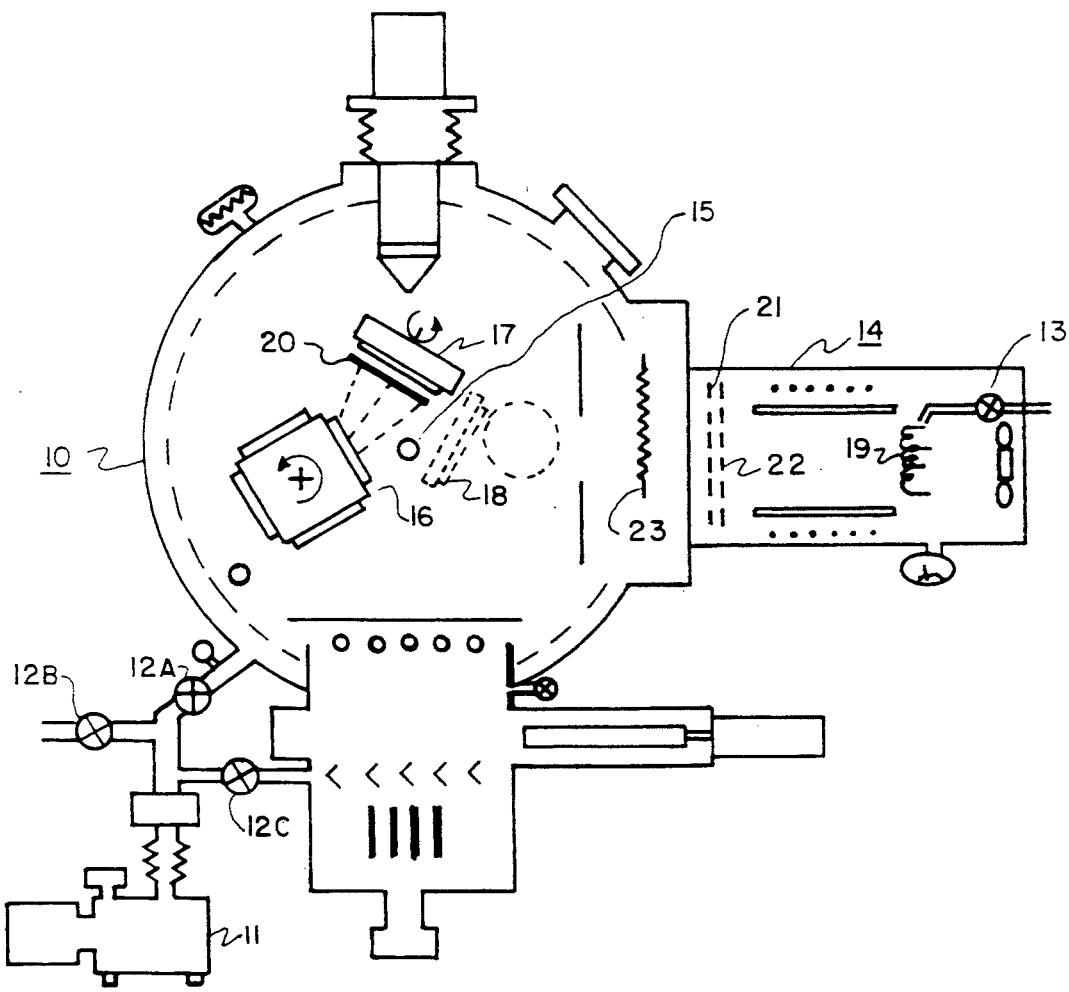
FIG. 1 shows a vacuum chamber equipped with an ion beam generator, water-cooled cooled sputtering targets and a water-cooled rotatable and translatable substrate holder for surface finishing and coating solid state electronic elements as, for example, the pyroelectric wafers of the present invention.

FIG. 1 shows a typical vacuum chamber 10 designed for ion milling operations. This particular chamber is manufactured by the Commonwealth Scientific Corporation, 500 Pendleton Stree, Alexandria, Va. 22314. The vacuum is provided by pump 11 through valves 12A and 12B. Valve 12C accommodates a leak detector when required. After initial pumpdown to a pressure of $2 \times 10^{-7}$ torr, oxygen is introduced into the chamber bringing the pressure to $2.5 \times 10^{-5}$ torr or higher. The oxygen enters the chamber through a separate gas inlet, 15, located near the water cooled rotatable four-sided sputter target, 16. Next, argon is introduced into the chamber through gas valve 13 located on the ionization chamber, 14, bringing the pressure to $1.5 \times 10^{-4}$ torr. Ions from the cathode 19 in the ionization chamber are shaped into a beam and accelerated toward the substrate holder 17 by electrically charged plates 21 and grids 22 in that chamber. The emerging beam is neutralized by injection of electrons from a special grid 23 in the main chamber between the ionization chamber and the substrate holder. The substrate holder may then be moved to place the substrate 18 in the ion beam. A shutter 20 on the substrate holder protects the substrate while the beam is being adjusted. The acceleration voltage is adjustable between 500 and 1000 volts and the beam current can be varied between 25 and 100 ma for this procedure.

Figure 1A:
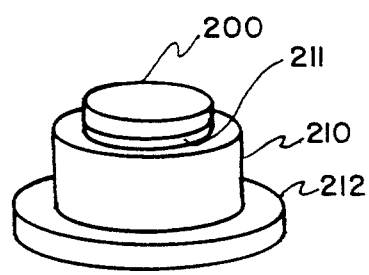
FIG. 1A shows a rough wafer mounted on a dish and pad for placement in a substrate holder.

Using the above chamber for for bariumstrontium titanate or other ferroelectrics formed from oxides of the elements Ti,Ba,Pb,St,Ca,La,Bi,Co,W,Sm,Li,Ta and Nb; applicants method involves the following steps:

A. Sawing a wafer several mil thick from a sintered mass of fine preciptates as described above;

B. Mechanically grinding the wafer to a thickness that varies between 1.5 and 2.5 mils;

C. As shown in FIG. 1A, mounting the wafer 200 on an aluminum disk shaped heat sink 210 using a layer of silicone grease 211;

D. Placing the heat sink on a rubber pad 212 and placing the rubber pad on the water cooled rotateable substrate holder in the vacuum chamber;

E. Adjusting the substrate holder to a position approximately 13.5 inches from the beam neutralizing grid and 6.5 inches from the oxygen inlet;

F. Tilting the substrate holder until the normal to the wafer surface makes an angle of 55 degrees to the axis of the ion beam path;

G. Adjusting the water cooling to the substrate holder to lower the wafer temperature to 2 degrees celsius;

H. Initiating rotation of the substrate holder;

I. Pulsing the ion beam on and off beginning with long 50% duty cycles and descreasing both the total time of the each cycle and the duty cycle to $\frac{1}{4}$ or less of their initial values in order to prevent overheating as the mass of the wafer decreases to provide a final thickness of approximately one mil, as prescribed for example in Table I, following.

TABLE I

| Cycle No. | Beam Schedule | | Repetitions |
|---|---|---|---|
| | Time On (min) | Time Off (min) | |
| 1 | 5 | 5 | 12 |
| 2 | 4 | 5 | 7 |

TABLE I-continued

| Cycle No. | Beam Schedule | | Repetitions |
|---|---|---|---|
| | Time On (min) | Time Off (min) | |
| 3 | 3 | 5 | 7 |
| 4 | 1 | 3 | 3 |
| 5 | 0.5 | 2 | 2 |

At this point a stable and useful product is obtained. If desired, however, the process can be continued with the following steps:

J. Moving the substrate holder by remote control to the sputter mode position;

K. Purging the chamber of oxygen;

L. Exposing a metal side on the four-sided sputtering target;

M. Directing the ion beam for a predetermined time cycle at the exposed metal side to form a conducting metal coating or electrode on one broad exposed face of the titanate wafer;

N. Reversing the wafer to grind and plate an electrode on the opposite face.

The narrow edge of the wafer normally will not be plated, but this can be insured by keeping it masked at all times in the holder or grinding the edge after removal from the substrate holder, so that the two coatings form separate electrodes. Again an even more useful product is obtained at this stage of the method.

Figure 2:
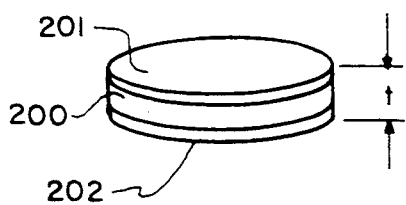
FIG. 2 shows a unitary pyroelectric wafer.

As shown in FIG. 2 the wafer 200 at this point is a viable detector. The wafer thickness is about one mil. The thickness of electrodes 201 and 202 are of the order of a micron so as to retain the excellent thermal properties of the wafer. The wafer can also be used as the anode of a cathode ray tube or soldered to the charge injectors of a CCD to form a thermal image detector, as have previous types of pyroelectric wafers. These image detectors, in turn, are combined with suitable optical imaging systems, wherein the optical elements are made from compounds which pass and refract infrared and far-infrared wavelengths as is well understood in the art.

Figure 3:
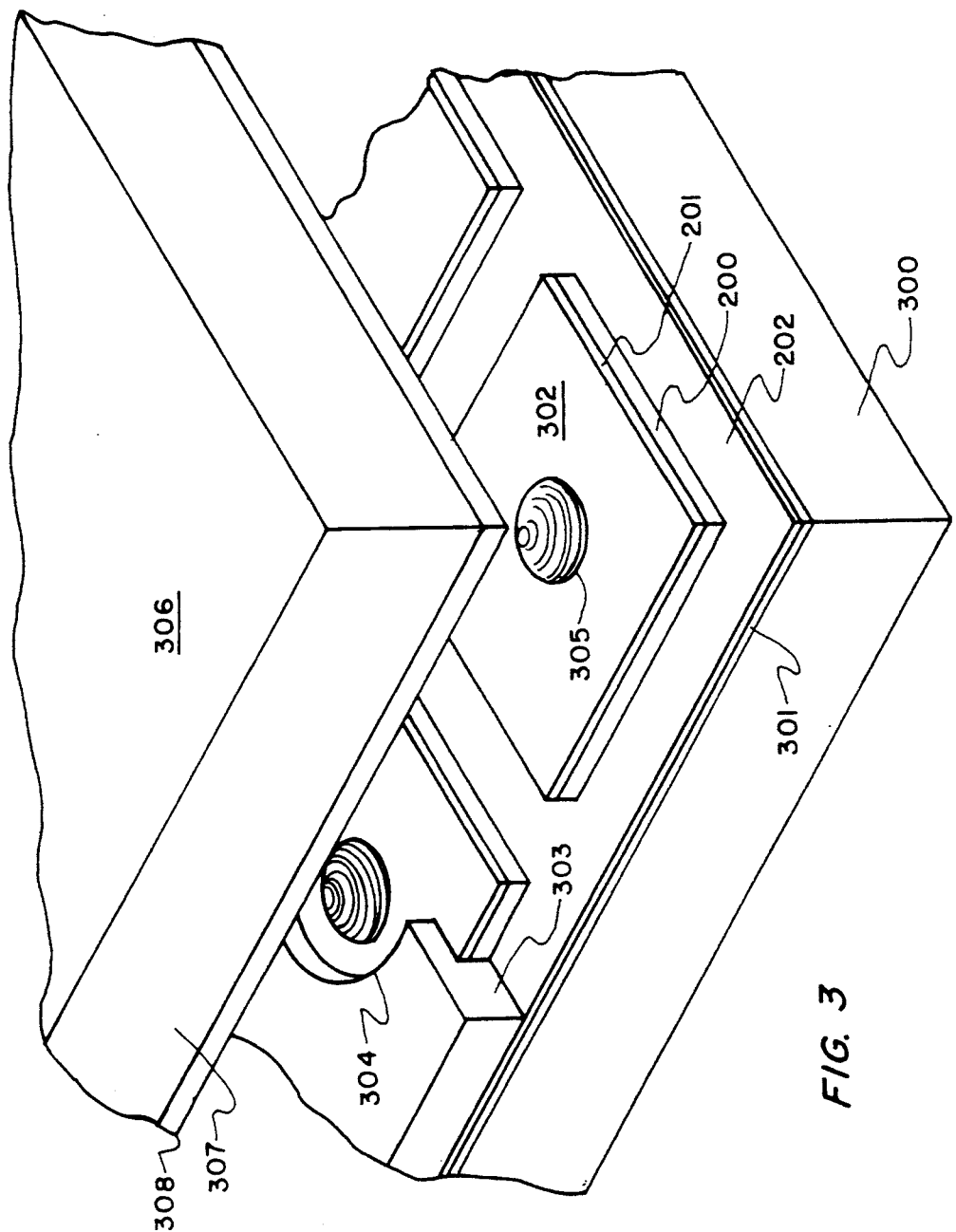
FIG. 3 shows the general structure of a solid state pyroelectric imager which uses applicants improved pyroelectric wafers.

FIG. 3 illustrates the following further processing steps that may be performed on the wafer to enhance its function as a thermal image detector, such as the steps of:

O. Coating at least one electrode with an infrared absorber layer 301 such as gold black, to increase absorption of the incident infrared light.

P. Mounting a support block 300 to the absorber layer 301 to stabilize the thin wafer 200;

Q. Dividing the wafer into tens, hundreds or thousands of smaller islands 302, each corresponding to a pixel for the imager, by ion milling or sublimation with an excimer laser;

R. Coating the exposed surface of the islands and electrode 202 with a layer 303 of solder resist;

S. Photolithigraphing a pattern of openings 304 through layer 303 each centered on one island;

T. Exposing the photoresist surface to a wave of molten solder or the like, bonding each island electrode 201 to a droplet 305 of solder which projects beyond the surface of the wafer or solder resist;

U. Pressing the droplets against similar structures on the charge injection devices of a charge-coupled-device or CCD 306 with or, without removing the solder resist layer; and V. Heating the compressed CCD and detector array to melt and combine each tangent pair of droplets.

The CCD is essentially a layer of one conductivity type semiconductor with an array of charge injection devices, a surface layer of passivation material and a much larger number of electrodes on or in the passivation layer some of which are inter-connected in groups by bus conductors. All of these electrodes, not shown, are initially electrically insulated by the passivation coating, which may be silicon dioxide. The unconnected electrodes of the charge injection devices are exposed using photolithography or related processes and attached to solder droplets in the same manner and pattern as shown on the detector array. The size of the droplets, the time and temperature to which the mated CCD and detector array are heated, are all adjusted to limit the flow of the solder as the droplets join so as to prevent short circuiting between detector elements or islands. The wells formed in the solder resist and the passivation coating may be used to store displaced solder, as the surfaces of these layers are pressed together, and to act as barriers to solder flow between islands. If the photoresist is removed the spaces between the islands may be filled with potting compound to provide a more solid and tightly sealed structure.

When making the above structure by applicants method the absorber coating can be applied by repeating steps J-M with the same or a different target, while perhaps adding an oxidant as a gas, like the oxygen used previously. The excimer laser can be used with the array outside the chamber, or with the array inside the chamber and the laser beam directed through a viewing port. Ion milling the spaces between the islands is best done by using a thick photolithed pattern of photoresist on the wafer that will last until the ion beam has removed the unmasked portions of the wafer. Applicant's method is also applicable to the methods disclosed in U.S. Pat. No. 4,927,771, "METHOD OF THERMAL ISOLATION OF DETECTOR ELEMENTS IN AN UNCOOLED STARING FOCAL PLANE ARRAY", to Donald A. Ferrett, granted May 22, 1990.

I claim:

1. An imaging pyroelectric detector element for an infrared imager, comprising:
    a thin wafer of precipitated, highly compacted and sintered metal oxides, having a homogeneous structure at its surface and throughout its bulk;
    said wafer also having a smooth and even imaging surface and a uniform thickness of the order of one mil.

2. A detector element according to claim 1, wherein: said wafer is formed with oxides of metals chosen from the group consisting of Ti, Ba, Pb, St, Ca, La, Bi, Co, W, Sm, Li, Ta, and Nb.

3. An infrared imager including an electronic read-out device and at least one pyroelectric detector element comprising:
    a thin wafer of precipitated, highly compacted and sintered metal oxides having a homogeneous molecular structure at its surface and throughout its bulk;
    said wafer having a smooth even surface and a uniform thickness of approximately one mil.

4. An imager according to claim 3, wherein:
    said wafer is divided into an array of islands, each of said (wafers) islands being coupled to a separate pixel input of said read-out device.

5. An imager according to claim 3; wherein:
    said read-out device is a cathode ray tube.

6. An imager according to claim 3; wherein:
    said read-out device is a silicon based charge coupled device.

7. A detector element according to claim 3, wherein:
    said wafer is formed with oxides of metals chosen from the group consisting of Ti, Ba, Pb, St, Ca, La, Bi, Co, W, Sm, Li, Ta, and Nb.

8. A detector element according to claim 4, wherein:
    said wafer is formed with oxides of metals chosen from the group consisting of Ti, Ba, Pb, St, Ca, La, Bi, Co, W, Sm, Li, Ta, and Nb.

9. A detector element according to claim 5, wherein:
    said wafer is formed with oxides of metals chosen from the group consisting of Ti, Ba, Pb, St, Ca, La, Bi, Co, W, Sm, Li, Ta, and Nb.

10. A detector element according to claim 6, wherein:
    said wafer is formed with oxides of metals chosen from the group consisting of Ti, Ba, Pb, St, Ca, La, Bi, Co, W, Sm, Li, Ta, and Nb.

11. A detector element according to claim 1, further including:
    A first electrode coated over at least one broad flat surface of said wafer, and
    a layer of infrared absorbing material coated over the opposite broad flat surface.

12. A detector element according to claim 11, further including:
    A second electrode coated over the opposite broad flat surface of said wafer under said absorbing layer.

13. A detector element according to claim 12, wherein:
    said element includes a plurality of intersecting grooves through the wafer and one of said first and srecond electrodes dividing said element into an array of pixel detectors.

* * * * *